Dec. 8, 1953 E. H. HUGENHOLTZ 2,662,214
FREQUENCY-MODULATED OSCILLATOR
Filed July 30, 1951
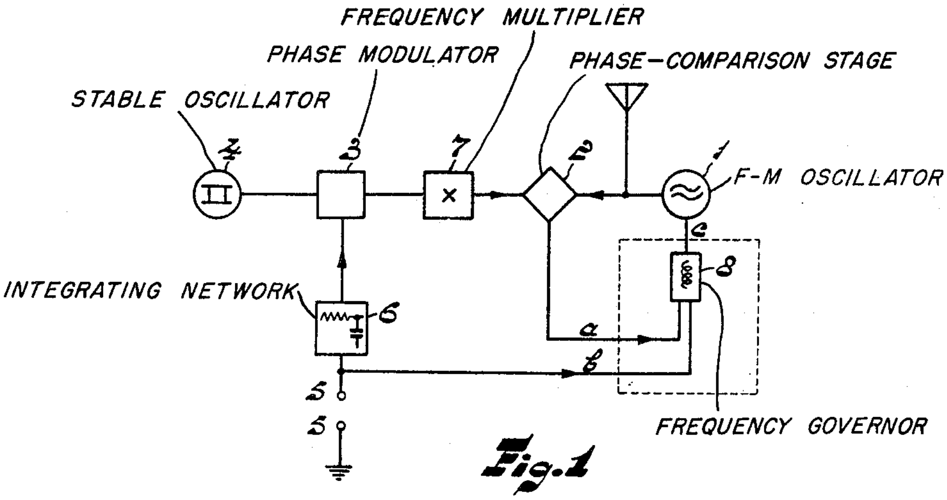
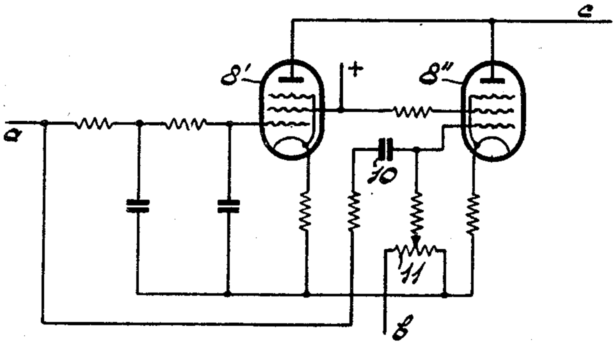
Fig. 2
INVENTOR
Eduard Herman Hugenholtz
By Fred M Vogel
AGENT Patented Dec. 8, 1953 2,662,214

UNITED STATES PATENT OFFICE 2,662,214

FREQUENCY-MODULATED OSCILLATOR

Eduard Herman Hugenholtz, Hilversum, Netherlands, assignor to Hartford National Bank and Trust Company, Hartford, Conn., as trustee Application July 30, 1951, Serial No. 239,232

3 Claims. (Cl. 332—19)

The invention relates to circuits for the frequency-modulation of an oscillator of the kind in which the oscillator frequency is synchronised with a frequency derived from a phase-modulator stage (which stage is controlled by the modulating oscillation) with the aid of a phase-comparing stage whose output controls the frequency-governing element of the oscillator. In this manner the frequency produced by the oscillator may be rendered identical with the frequency derived from the phase-modulator stage.

In the known circuits of this kind the control-voltage responsible for the frequency-sweep of the oscillator is entirely supplied by the phase-comparing stage. We have found that there is a tendency towards instability in these known circuits and, more particularly, a tendency towards self-oscillation of the closed circuit formed by the oscillator, the phase-comparing stage and the frequency-governing element.

According to the invention a material improvement is achieved as regards stability by additionally supplying the modulating oscillation to the frequency-governing element of the oscillator in such manner as to permit reduction of the oscillation-amplitude needed at the output of the phase-comparing stage for supply to the said element.

In order that the invention may be more clearly understood and readily carried into effect, one embodiment will now be described with reference to the accompanying drawing, in which:

Fig. 1 shows a block diagram, and

Fig. 2 is a detail view of part of the diagram shown in Fig. 1.

Referring to Fig. 1, 1 designates a frequency-modulated oscillator and 2 a phase-comparing stage, for example a mixer, the output of which comprises a bandpass filter passing a band of relatively low frequencies. Reference 3 designates a phase modulator, with the aid of which the oscillation produced by a stable oscillator 4, for example a crystal oscillator is phase-modulated in accordance with a modulating oscillation supplied to the phase-modulator 3 from the terminals 5 by way of an integrating network 6. The phase of the oscillation produced by the oscillator 1 is compared in stage 2 with the phase of an oscillation derived from the phase-modulator stage 3 via, for example, one or more frequency multiplying stages 7 and the output of stage 2 is fed at *a* to a frequency-governing element 8, for example a reactance tube or other control-tube, controlling the oscillator.

The oscillation produced by the oscillator 1 is thus synchronised with the output oscillation of the frequency multiplier 7, these two oscillations having identical frequencies. Consequently the oscillator 1 produces a frequency-modulated oscillation corresponding with the modulating oscillation across the terminals 5, the central frequency of this oscillation being determined by the frequency of the stable oscillator 4.

The circuit so far described is of the known kind already defined and, as stated, has a tendency to instability, which is due according to the investigations we have carried out to the fact that the closed circuit formed by the oscillator 1, the phase-comparing stage 2 and the frequency-governing element 8 exhibits a negative feedback action operating against the phase divergence between the oscillation of the oscillator and the output oscillation of the frequency multiplier 7; so long as the phase-comparing stage 2 has to supply (in the known manner) the full modulation voltage to control the oscillator 1, this feedback must be comparatively strong, so that the probability of self-oscillation of this circuit arises.

The probability of instability is materially reduced when in accordance with the invention, the modulating oscillation is additionally supplied at *b* to the frequency-governing element 8 of the oscillator 1 and the phase-comparing stage 2 need only supply a voltage which is proportional to the difference between the central frequency of the output oscillation of the frequency multiplier 7 and the central frequency of the oscillation which the oscillator 1 would produce if the control across the phase-comparing stage 2 and the frequency-governing element 8 were not provided.

Instead of using the frequency multiplier 7, or in conjunction herewith, use may be made with advantage of a pulse stage, which converts the output of the phase modulator stage 3 into pulses of short duration, use then being made of a gated mixing stage for the phase-comparing stage 2. In this case the frequency of the oscillator 1 may be equal to a very high harmonic of the frequency of the phase-modulator stage 3.

Referring to Fig. 2 a suitable frequency-governing element 8 for use in accordance with the invention is shown more in detail. In order to ensure that the phase-comparing stage 2 need supply only direct voltage and very low frequencies it is advisable to include the parallel combination of two control tubes in the frequency-governing element 8. One of these tubes (8′, Fig. 2) has a large control-range but is only controlled by the direct voltage component and the slow variations of the voltage formed by the combination of the output voltage (*a*) of the phase-comparing stage 2 and the modulating voltage (*b*) across the terminals 5, whereas the other control tube (8'') is adjusted to a constant grid bias voltage and hence to a constant mutual conductance. This latter tube 8'' receives from a capacitor 10 the alternating voltage component of the output voltage (*a*) of the phase-comparing stage 2 and through a potentiometer 11 the voltage (*b*) across the terminals 5; with the aid of this potentiometer and, if necessary, with the use of additional phase-correcting elements it is ensured that at least for the higher modulation frequencies the phase comparing stage 2 need not supply voltage. The total output current (*c*) of the tubes 8' and 8'' controls the frequency of the oscillator 1.

If necessary, additional measures may be taken in order to ensure also in the case of a change-over of the oscillators 1 and 4 to another frequency that the phase-comparing stage 2 has practically not to supply alternating voltage.

In order to suppress any further tendency towards instability of the control-circuit due to phase shift in the output circuit of the phase-comparing stage 7, the output network of the phase-comparing stage 2 may have connected in parallel with it a tuned series circuit which raises the critical frequency at which the closed circuit 1, 2, 8 might tend to self-oscillate.

What I claim is:

1. A circuit for frequency-modulating an oscillator with a modulating voltage and for synchronizing said oscillator comprising a frequency governing device coupled to said oscillator for varying the frequency thereof, a source of stable oscillations, means including a phase modulator coupled to said source to produce a synchronization wave phase-modulated by said modulating voltage, a phase comparison device responsive to said synchronization wave and coupled to said oscillator to produce a control voltage, means to apply said control voltage to said governing device to vary the frequency of said oscillator accordingly, and means to apply said modulating voltage to said governing device also to frequency-modulate said oscillator, whereby a reduction in the amplitude requirements for said control voltage is effected.

2. A circuit, as set forth in claim 1, wherein said source of stable oscillations operates at a frequency which is a sub-harmonic of the mean frequency of said oscillator, and said means to produce a synchronization wave includes a frequency multiplier to raise the frequency produced by said source to the frequency corresponding to said mean frequency.

3. A circuit, as set forth in claim 1, wherein said frequency governing device is constituted by first and second reactance tube circuits coupled in parallel relation to said oscillator, said first reactance tube circuit having a relatively large control range with respect to the second circuit, means to apply said control voltage to the input of said first reactance tube circuit, and means to apply said modulating voltage to the input of said second reactance tube circuit.

EDUARD HERMAN HUGENHOLTZ.

References Cited in the file of this patent

UNITED STATES PATENTS

| Number | Name | Date |
|---|---|---|
| 2,279,659 | Crosby | Apr. 14, 1942 |
| 2,310,260 | Schock | Feb. 9, 1943 |